United States Patent [19]

Ishihara et al.

[11] Patent Number: 4,604,496

[45] Date of Patent: Aug. 5, 1986

[54] CERAMIC MULTILAYER WIRING BOARD

[75] Inventors: Shosaku Ishihara, Kamakura; Takashi Kuroki, Yokohama; Gyozo Toda, Hino; Akio Yasukawa; Tatsuji Sakamoto, both of Ibaraki, all of Japan

[73] Assignee: Hitachi, Ltd, Tokyo, Japan

[21] Appl. No.: 640,582

[22] Filed: Aug. 14, 1984

[30] Foreign Application Priority Data

Aug. 25, 1983 [JP] Japan ................... 58-154052

[51] Int. Cl.[4] ........................... H05K 1/02
[52] U.S. Cl. ..................... 174/68.5; 361/414
[58] Field of Search ............. 174/68.5; 361/414

[56] References Cited

U.S. PATENT DOCUMENTS

| 3,250,848 | 5/1966 | Beelitz et al. | 174/68.5 |
| 3,561,110 | 2/1971 | Feulner et al. | 361/414 X |
| 4,211,603 | 7/1980 | Reed | 174/68.5 X |
| 4,237,606 | 12/1980 | Niwa et al. | 174/68.5 X |
| 4,336,551 | 6/1982 | Fujita et al. | 174/68.5 X |
| 4,368,503 | 1/1983 | Kurosawa et al. | 361/414 |

Primary Examiner—R. R. Kucia
Attorney, Agent, or Firm—Antonelli, Terry & Wands

[57] ABSTRACT

A ceramic multilayer wiring board is provided in which ceramic insulating layers and wiring patterns provided thereon are connected by conductors filling through-holes formed in the ceramic insulating layers. The through-holes are so formed that the superficial portions of each through-hole of the ceramic multilayer wiring board is smaller in diameter than the inside portion of the through-hole between the superficial portion. This can prevent the board from being cracked around the through-holes.

6 Claims, 12 Drawing Figures

CERAMIC MULTILAYER WIRING BOARD

BACKGROUND OF THE INVENTION

1. Field of the Invention

This invention relates to a ceramic multilayer wiring board.

2. Description of the Prior Art

Generally, ceramic multilayer wiring boards are provided with through-holes filled with a conductor for connecting the multilayer wiring patterns to each other. In conventional ceramic multilayer wiring boards, as illustrated in FIG. 1 of the drawings attached hereto, the diameter of each through-hole 3 filled with a conductor 2 was same in both the surface and inside layers of the board 1. The same thing is seen in the device of U.S. Pat. No. 4,345,955.

Such conventional ceramic multilayer wiring boards were liable to suffer from cracks 4 around the conductor-filled through-holes 3 as shown in FIG. 2 because of the greater coefficient of thermal expansion of the ceramic material used for the substrate than that of the conductor in the through-holes.

SUMMARY OF THE INVENTION

The object of this invention is to provide a ceramic multilayer wiring board which is safe against cracking around the through-holes filled with a conductor on both the sides of the board.

This object of the invention can be attained by adopting a specific through-hole design in which the superficial portions of each through-hole at both the sides of the ceramic multilayer wiring board is made smaller in diameter than the inside portion of the through-hole between the superficial portions.

This novel fact has been disclosed for the first time by the present inventors as a result of a stress analysis of the through-hole diameter and pitch in the surface of ceramic multilayer wiring board and the depth of the through-hole portion in the surface of the wiring board toward the inside layer thereof according to a finite element method.

BRIEF DESCRIPTION OF THE DRAWINGS

FIGS. 3-1 to 3-5 and FIGS. 4-1 to 4-3 are flow charts showing the sequential steps for production of ceramic multilayer wiring boards according to this invention.

FIG. 5 is a graph showing the relation between the through-hole diameter in the surface of the board and the stress acting to the interface of the through-hole the conductor and the ceramic substrate as determined by changing the interval of through-holes in the surface (on both the sides) of a ceramic multilayer wiring board.

DETAILED DESCRIPTION OF THE PREFERRED EMBODIMENTS

This invention will be described in further detail hereinbelow with reference to the embodiments thereof.

EXAMPLE 1

Preparation of a Green Sheet

Powders of $Al_2O_3$, $SiO_2$ and $MgO$ having a particle size of $5\mu$ or less were weighed and mixed so that their ratios would become 93%, 5.2% and 1.8% by weight, respectively. To this mixture was added polyvinyl butyral as an organic binder in an amount of 8.5% by weight based on the total weight of the mixture, followed by further addition of an azeotrope as a solvent in an amount of 45% by weight based on the total weight of the mixture.

These materials were mixed up well in a ball mill to form a slurry in which the ceramic powders were dispersed uniformly. Then a few drops of a defoaming agent were added to the slurry and the latter was stirred and deaerated under reduced pressure to remove air cells in the slurry. This slurry was cast into a thin green sheet by using a doctor blade type casting machine.

In this Example, two types of green sheets, one being 0.25 mm and the other being 0.1 mm in thickness, were prepared.

PREPARATION OF A CONDUCTIVE PASTE

A W (tungsten) powder material prepared from a 3:7 (by weight) mixture of W powder of 0.5 $\mu$m in average particle size and W powder of 3.0 $\mu$m in average particle size, ethyl cellulose as an organic binder and diethylene glycol as an organic solvent were blended in the ratio of 80:2.5:17.5 in percent by weight, and the blend was ground and mixed up by a triturator consisting of an alumina-made mortar and a pestle for three hours. This mixture was subjected to an ordinary three-roll mill for 30-minute kneading. To 100 g of this kneaded material was added 3 g of butyl carbitol. The resultant mixture was kneaded by a three-roll mill for 10 minutes to obtain a conductive paste.

Preparation of a Ceramic Multilayer Wiring Board

Figure 1:
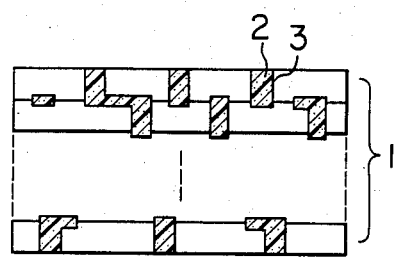
FIG. 1 is a sectional view of a conventional ceramic multilayer wiring board.
Figure 2:
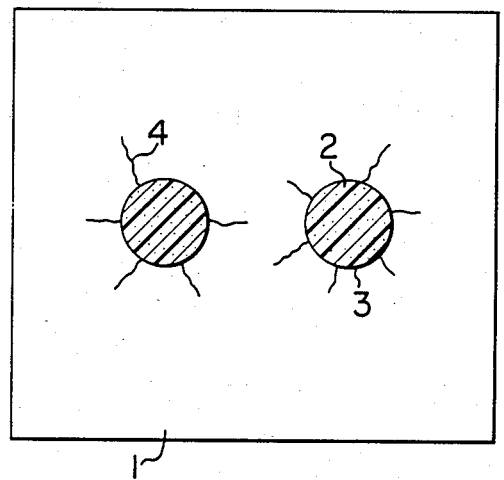
FIG. 2 is a sketch showing the formation of fine cracks around the through-holes filled with a conductor in the surface of a conventional ceramic multilayer wiring board.
Figures 1, 3:
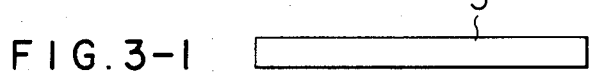
Figures 2, 3:
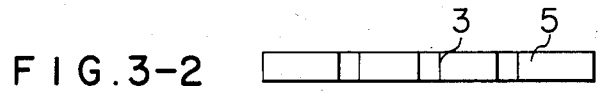
Figure 3:
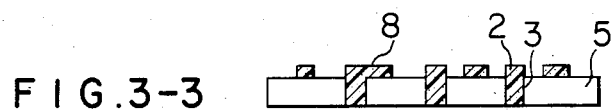

The 0.25 mm thick green sheet obtained in the manner described above was cut into an 80 mm×80 mm green sheet 5 as shown in FIG. 3-1. This green sheet 5 was subjected to die-cutting by a blanking die having a carbide pin to form total 2,500 through-holes 3 of 0.15 mm in diameter at intervals of 0.5 mm in 50 lines both lengthwise and breadthwise as shown in FIG. 3-2.

Then the conductive paste was screen-printed on the green sheet 5 to fill the through-holes 3 with the conductive paste and form a 0.1 mm wide wiring pattern on the green sheet 5 to make a non-baked (green) wiring sheet as shown in FIG. 3-3.

Figures 3, 4:
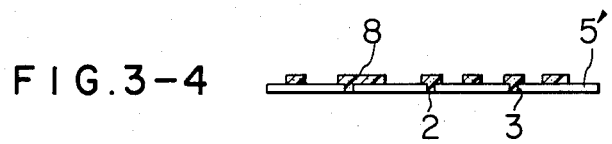

Another 0.1 mm thick green sheet obtained in the previous step was also treated in the manner described above (FIG. 3-2) to form total 2,500 through-holes of 0.08 mm in diameter at intervals of 0.5 mm in 50 lines both lengthwise and breadthwise and further treated according to said process of FIG. 3-3 for filling the throughholes 3 with the conductive paste and forming a 0.1 mm wide wiring pattern on the green sheet 5' to make a nonbaked wiring sheet (FIG. 3-4).

Figures 3, 4, 5:
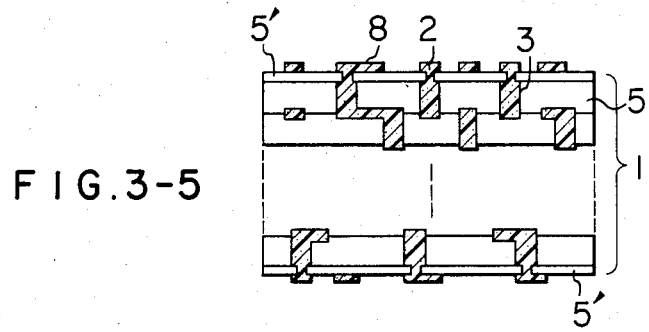
Figures 1, 4:
Figures 2, 4:
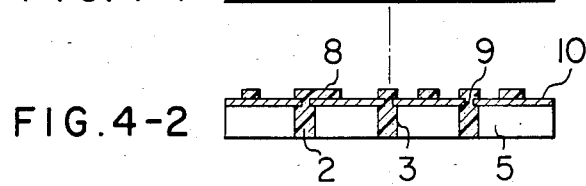
Figures 3, 4:
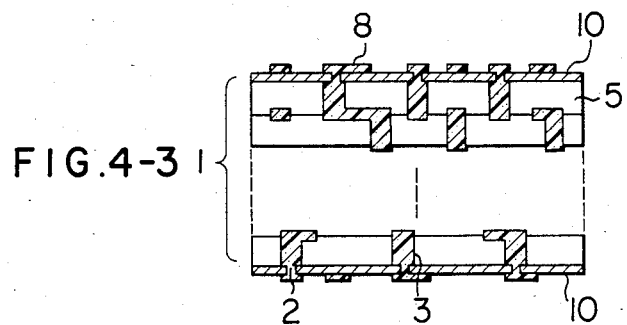
Figure 5:
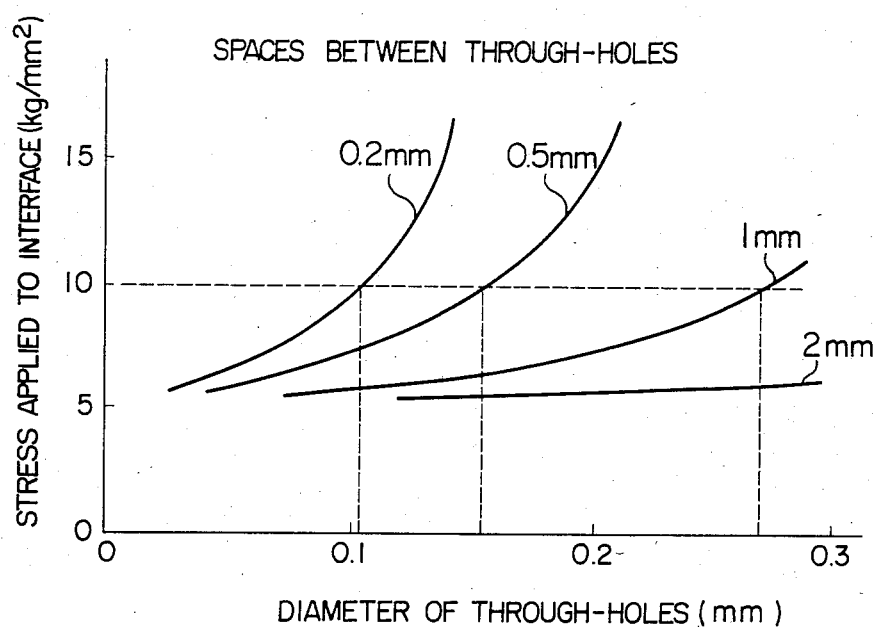

Then the eighteen (18) non-baked wiring sheets of FIG. 3-3 were placed one upon another to form a pile of said wiring sheets, and further the non-baked wiring sheets shown in FIG. 3-4 were layed over both the sides of said pile of sheets so that the wiring pattern would come on the outside as shown in FIG. 3-4, and they were laminated by hot pressing under 50 kg/cm² at 100° C. to make a non-baked multilayer wiring board as shown in FIG. 3-5.

This non-baked multilayer wiring board was heated from room temperature to 1,000° C. at a rate of 200° C./h in a box-type electric furnace using molybdenum as a heating element and maintained at this temperature for one hour. Thereafter, it was again heated to 1,600° C. at a rate of 200° C./h and maintained at this temperature for one hour to complete the baking. This was followed by cooling to obtain a ceramic multilayer wiring board.

In the above process, heating and cooling were conducted in an atmosphere of an $N_2$ and $H_2$ (5:2) mixed gas containing water vapor. For creating said atmosphere, both of the gases, i.e., $N_2$ gas and $H_2$ gas, were introduced into said electric furnace at the flow rates of 1,000 1/h and 400 1/h, respectively, through a bubbler containing water of 45° C.

The obtained ceramic multilayer wiring board had a density of 3.5 g/cm³ and a shrinkage factor of 14%.

The light microscopical examination of the areas around 2,500 through-holes in the board showed no sign of cracks in said areas.

Also, the thus obtained ceramic multilayer wiring board can be increased in a wiring density as it is possible to narrow the space between the through-holes filled with a conductor in the surface of the wiring board. It is also an advantage of this invention that the multilayer board thickness can be reduced in comparison with the conventional boards with the same wiring density.

It is another advantage of this invention that the present ceramic multilayer wiring board is safe from warping even if the board thickness is reduced, since the front and rear sides of the wiring board are of a structure similar to each other.

EXAMPLE 2

Preparation of a Ceramic Paste $Al_2O_3$, $SiO_2$ and MgO powders having a maximum particle size of not greater than 5 μm were blended in the ratio of 93:5.2:1.8 in percent by weight. To 100 g of this mixture were added 0.5 g of ethyl cellulose and 5.5 g of polyvinyl butyral as an organic binder and 36 cc of trichloroethylene and 8 cc of perchloroethylene as an organic solvent. These materials were mixed up and kneaded in the same way as described in the section of 'Preparation of conductive paste' in Example 1 to obtain a ceramic paste.

Preparation of Ceramic Multilayer Wiring Board

An 80 mm×80 mm×0.25 mm thick green sheet made in the same way as in Example 1 was treated in the same manner as in Example 1 to form total 2,500 through-holes, all being 0.15 mm in diameter and arranged at intervals of 0.5 mm in 50 lines both lengthwise and breadthwise.

This green sheet was subjected to screen printing to fill the through-holes 3 with a conductive paste 2 as used in Example 1 to obtain a green sheet of FIG. 4-1.

The above-mentioned ceramic paste was screen printed on one side of each of the two green sheets to provide a 0.1 mm thick printed layer 10 having via-holes 9 on one side of said 80 mm×80 mm×0.25 mm thick green sheet 5 as shown in FIG. 4-2. Then a conductive paste as used in Example 1 was further screen printed to fill the via-holes 9 with said conductive paste to form a 0.1 mm wide wiring pattern 8.

Also, said 80 mm×80 mm×0.25 mm thick green sheet was provided with 2,500 through-holes after the same manner as that of Example 1, and such eighteen green sheets were piled by laying one over another. Then the green sheet formed with said printed layer was layed on both the sides of said 18-sheet pile so that the printed layer would come on the outside, and they were laminated and baked according to the procedure of Example 1 to make a ceramic multilayer wiring board (FIG. 4-3).

The thus obtained ceramic multilayer wiring board had a density of 3.5 g/cm³ and a shrinkage factor of 14%.

The light microscopical examination of the areas around 2,500 via-holes in the board gave the same result as obtained with the product of Example 1.

It was also found that the thus obtained ceramic multilayer wiring board had the same excellent advantages as seen with the product of Example 1.

EXAMPLE 3

FIG. 5 is a graph showing the extent of endurance of the ceramic multilayer wiring board against cracking around the through-holes in relation to through-hole diameter (mm) on both the sides of the board when the spaces between the holes varied to 0.2 mm, 0.3 mm, 0.5 mm and 1 mm. In the ceramic substrate there occur cracks when a stress greater than 10 kg/mm² is applied to the interface between the conductor filling the through-holes and the ceramic substrate.

It will be seen that the maximum through-hole diameter that can bear with cracking is 0.103 mm for the space of 0.2 mm, 0.145 mm for the space of 0.5 mm and 0.268 mm for the space of 1.0 mm.

EXAMPLE 4

Figure 6:
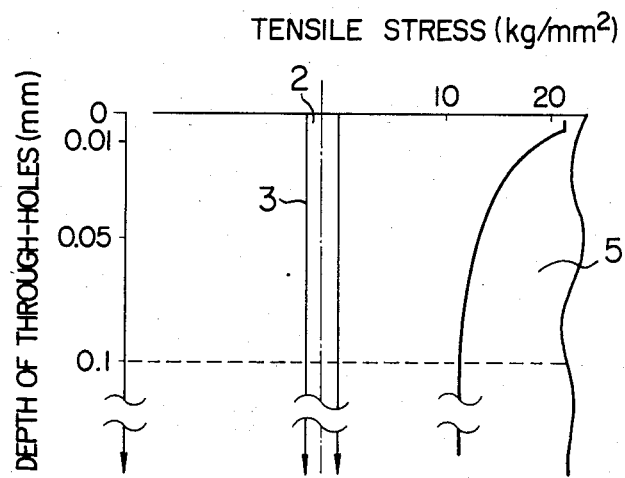
FIG. 6 is a graph showing the change in the thickness-wise direction of the tensile stress acting to the ceramic aroung the through-holes.

FIG. 6 shows the amount of tensile stress that acts to the ceramic substrate in contact with the conductor 2 in each through-hole 3 in accordance with the through-hole depth from the board surface. It is noted that no crack is generated around the through-holes if the throughhole diameter is reduced to the depth of 0.1 mm from the surface of the ceramic multilayer wiring board.

COMPARATIVE EXAMPLE 80 mm×80 mm×0.25 mm green sheets were prepared according to the process of Example 1, and each sheet was formed with 2,500 through-holes of 0.15 mm in diameter in the same way as in Example 1. Then the through-holes were filled with the conductor paste and a 0.1 mm wide wiring pattern was printed by following the procedures of Example 1.

20 pieces of the thus prepared non-baked wiring boards were laminated by hot pressing and baked by the methods used in Example 1 to obtain a ceramic multilayer wiring board.

The light microscopical examination of the areas around the throuhg-holes on both the sides of this ceramic wiring board showed a cracking rate of 45%.

What is claimed is:

1. In a ceramic multilayer wiring board having ceramic insulating layers and wiring patterns provided thereon, said wiring patterns being connected through said ceramic insulating layers by conductors filling a plurality of through-holes formed on said ceramic insulating layers, the improvement in which each of the through-holes range from 0.103 to 0.26 mm in diameter at the superficial portions thereof located at both sides of said ceramic multilayer wiring board, the space between adjacent superficial portions of the through-holes ranges from 0.2 to 1 mm, and the depth of the superficial portions of the through-holes is 0.1 mm or more; said superficial portions of the through-holes being smaller in diameter than inside portions of the through-holes arranged between said superficial portions.

2. A ceramic multilayer wiring board according to claim 1 wherein outermost ceramic insulating layers define the superficial portions of the through-holes and each have a thickness that is smaller than the thicknesses of the insulating layers defining the inside portions of the through-holes arranged between the superficial portions.

3. A ceramic multilayer wiring board according to claim 2 wherein the superficial portions of the through-holes extend through each of the outermost ceramic layers and occurrence of cracks in the areas of the ceramic layers surrounding the superficial portions is prevented.

4. A ceramic multilayer wiring board according to claim 1, wherein the through-hole diameter of the superficial portions is 0.103 mm or less when the space between the through-holes is 0.2 mm.

5. A ceramic multilayer wiring board according to claim 1, wherein the through-hole diameter is 0.145 mm or less when the space between the through-holes is 0.5 mm.

6. A ceramic multilayer wiring board according to claim 1, wherein the through-hole diameter of the superficial portions is 0.268 mm or less when the space between the through-holes is 1 mm.

* * * * *